United States Patent [19]

Mori

[11] Patent Number: 5,736,442
[45] Date of Patent: Apr. 7, 1998

[54] METHOD OF MANUFACTURING A SEMICONDUCTOR MEMORY DEVICE

[75] Inventor: Seiichi Mori, Tokyo, Japan

[73] Assignee: Kabushiki Kaisha Toshiba, Kawasaki, Japan

[21] Appl. No.: 710,243

[22] Filed: Sep. 13, 1996

[30] Foreign Application Priority Data

Sep. 14, 1995 [JP] Japan .................................. 7-236339

[51] Int. Cl.⁶ .................................................. H01L 21/824
[52] U.S. Cl. ........................... 438/257; 438/303; 438/279
[58] Field of Search ........................ 437/43, 52; 428/257, 428/279, 303

[56] References Cited

U.S. PATENT DOCUMENTS 5,019,527  5/1991  Ohshima et al. .
5,470,773  11/1995  Liu et al. ................................ 437/43
5,552,331  9/1996  Hsu et al. .............................. 438/303
5,568,422  10/1996  Fujiwara ........................... 365/185.33

Primary Examiner—John Niebling
Assistant Examiner—Richard A. Booth
Attorney, Agent, or Firm—Banner & Witcoff, Ltd.

[57] ABSTRACT

In a method of manufacturing a semiconductor memory device, before an exposed portion of the element separating isolation film is subjected to etching according to the SAS technique, an isolation film is laminated on the entirety of laminated gate structure, and thereafter, the exposed portion of the element separating isolation film is removed by etching while protecting the side surface of the floating gate with the isolation film.

14 Claims, 7 Drawing Sheets

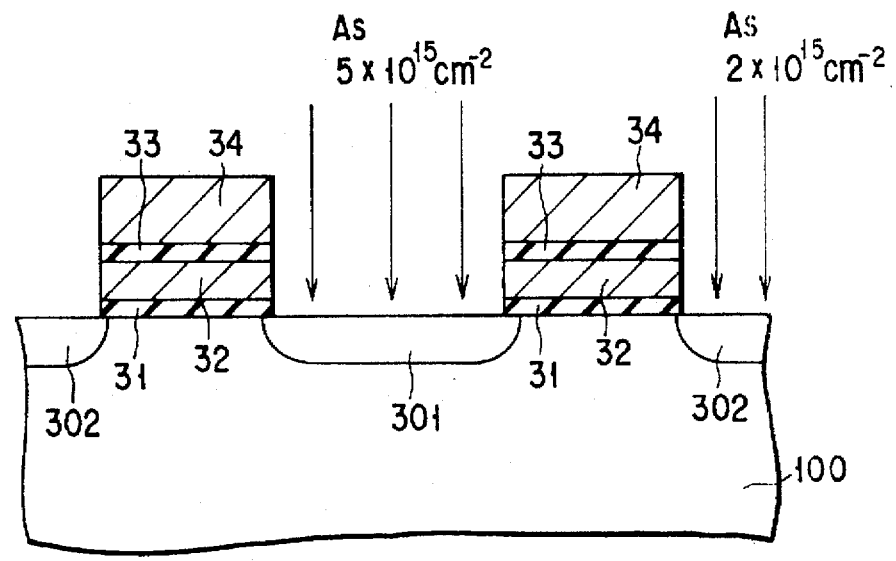
F I G. 1
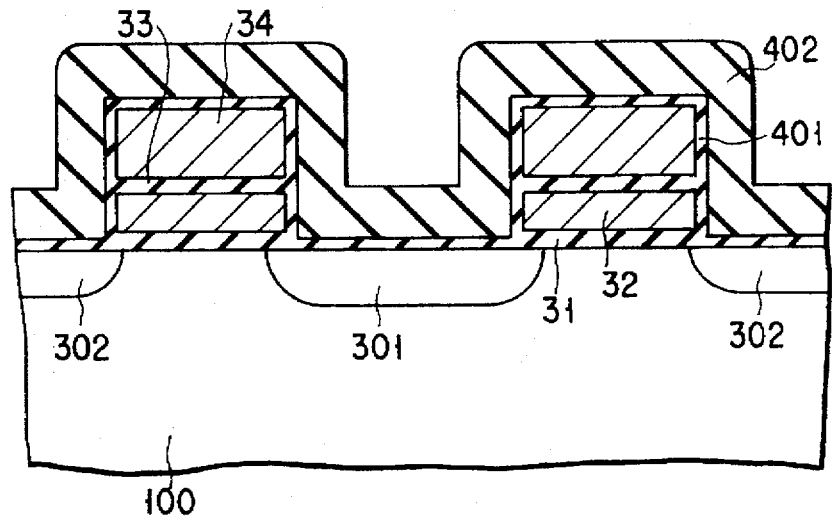
F I G. 2
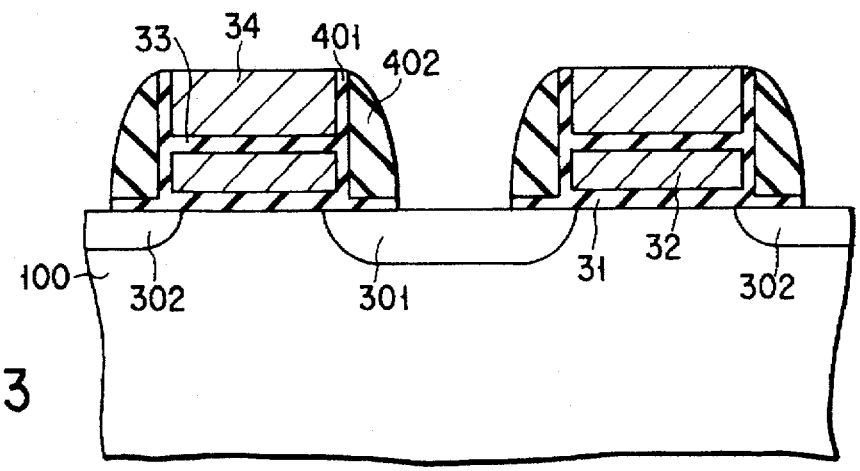
F I G. 3

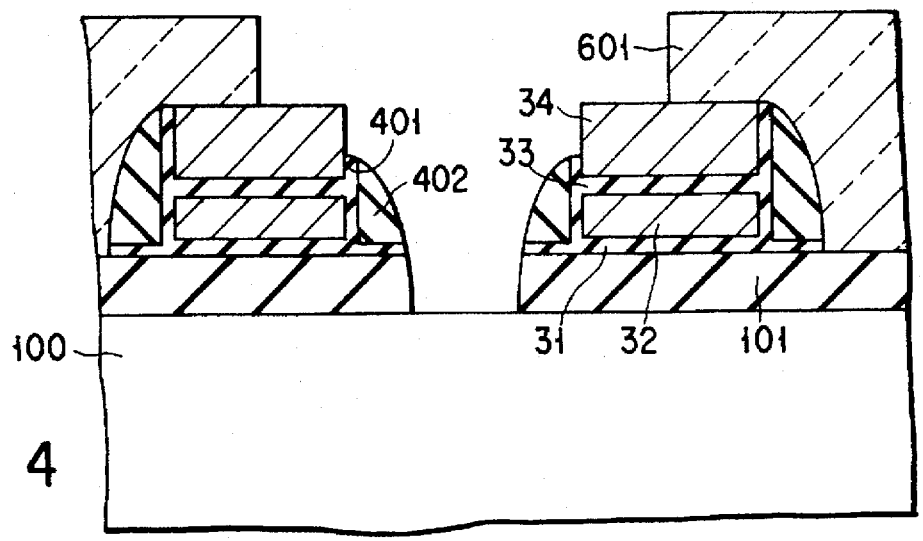
F I G. 4
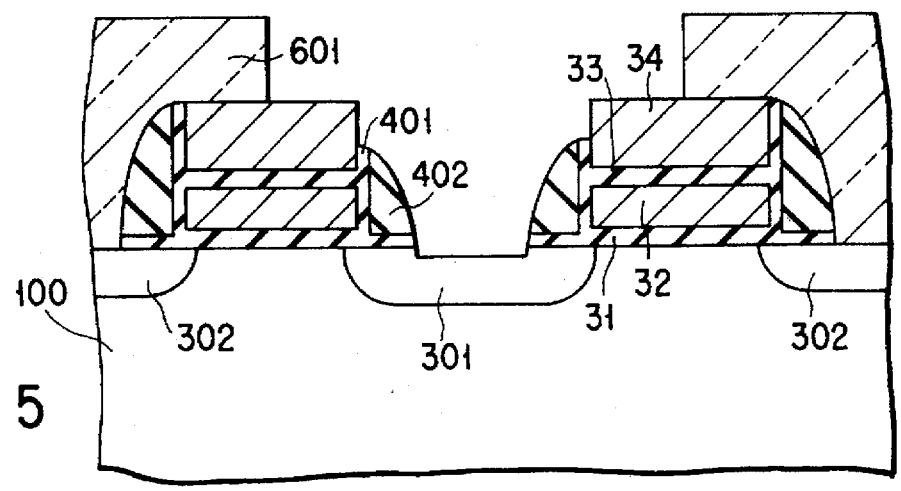
F I G. 5
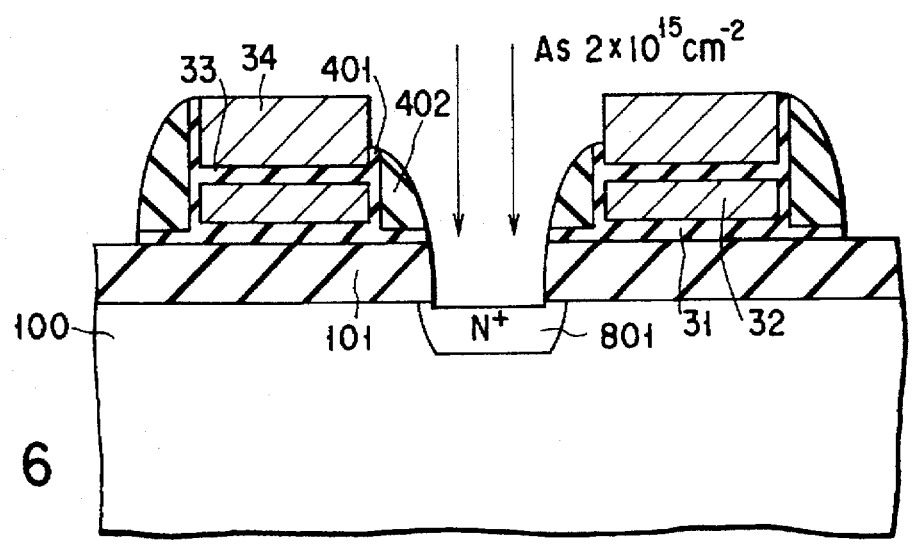
F I G. 6

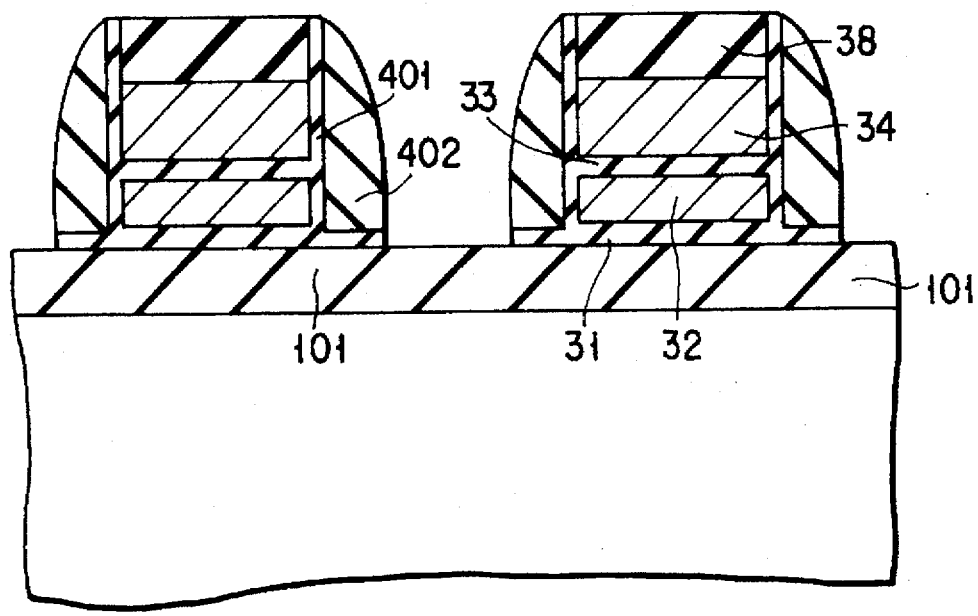
F I G. 7
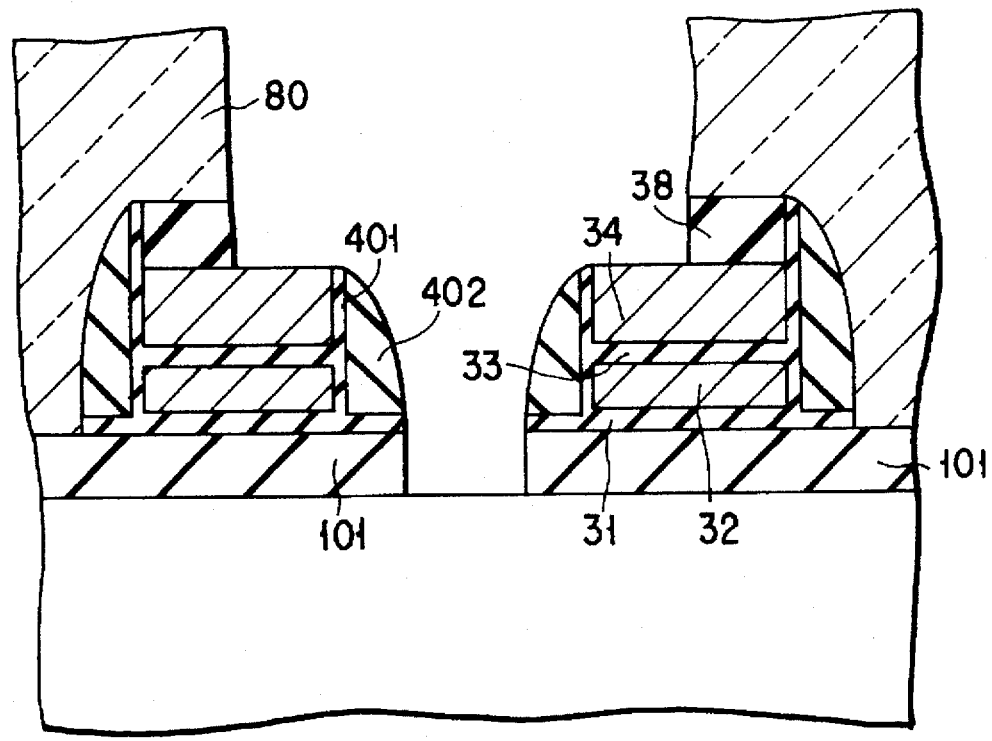
F I G. 8

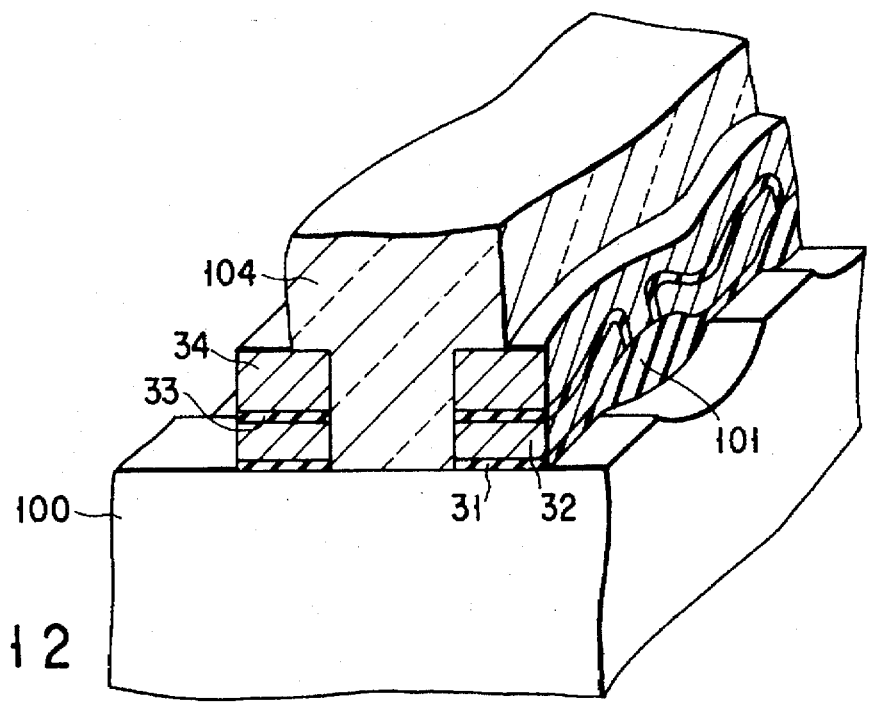
F I G. 12
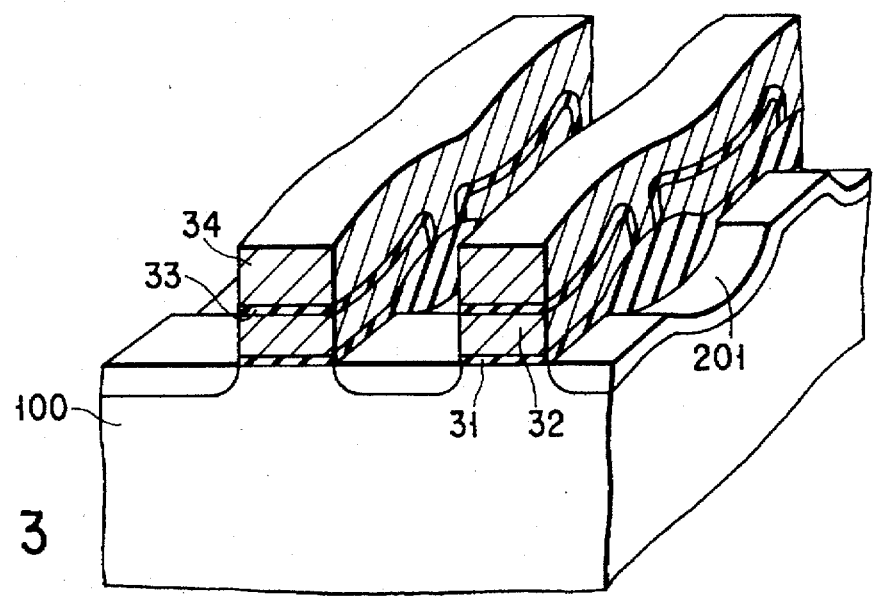
F I G. 13
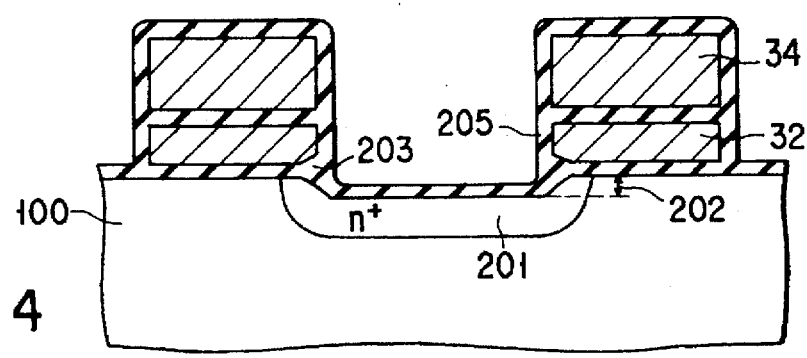
F I G. 14

METHOD OF MANUFACTURING A SEMICONDUCTOR MEMORY DEVICE

BACKGROUND OF THE INVENTION

1. Field of the Invention

The present invention relates to a method of manufacturing a semiconductor memory, and in particular, to improvement in a SAS (Self Aligned Source) technique, which is applied to a case of manufacturing a high-density memory cell array of a nonvolatile semiconductor memory such as a flash EEPROM, etc.

2. Description of the Related Art

In a case of manufacturing an EPROM array of a high-density nonvolatile memory, in particular, an NOR type flash memory (IEDM Digest of Technical Papers, p95, 1990), Mr. Y. Oshima and others have disclosed a technique of forming source diffusion layers of individual cells and a diffusion wiring layer for interconnecting these source layers in self-aligned manner with the gate electrode wiring. The aforesaid technique comprises the following steps of forming an element separating oxide film and a gate electrode on a semiconductor substrate; covering a substrate portion on the side to be formed as a drain diffusion layer interposed between gates, with a photoresist film; removing the photoresist covering a substrate portion on the side to be formed as a source diffusion layer and a wiring layer, and removing the element separating oxide film on the substrate portion by etching. This is called an SAS (Self Aligned Source) technique.

The SAS technique will be described below in detail with reference to FIGS. 10 to 13.

FIG. 10 is a perspective view of a semiconductor substrate. The surface of a semiconductor substrate 100 is formed in a stripe scheme with a plurality of element separating oxide films, that is, element separating isolation films 101 (two in the figure). These element separating oxide films 101 are formed by a known LOCOS (selective oxidation of silicon) method.

Thereafter, as seen from FIG. 11, a laminated gate structure is formed on the semiconductor substrate 100. The laminated gate structure comprises a floating gate, a control gate, etc. The following is the formation process of the semiconductor device shown in FIG. 11. First, the surface of the semiconductor substrate 100 is formed in a stripe scheme with a plurality of element isolation oxide films 101. Next, a laminated film is formed on the semiconductor substrate 100 in which the element separating oxide films 101 are already formed. The laminated film comprises an oxide film layer 31, a polysilicon layer 32 having a slit formed on the element separating oxide films 101, an oxide film layer 33 and a polysilicon layer 34, which are successively formed in the order on the surface of the semiconductor substrate 100. Subsequently, the laminated film is patterned into a stripe scheme so that the patterned film is orthogonal to the element separating oxide film layers 101. The patterning is carried out in the manner as described above. As a result, the patterned laminated gate structure comprises the oxide film layer 31 used as a gate isolation film, the polysilicon layer 32 used as a floating gate, the oxide film layer 33 used as an inter layer gate isolation film and the polysilicon layer 34 used as a control gate.

Next, a photoresist layer is applied on the surface of the substrate in which the laminated films are already formed. Thereafter, as shown in FIG. 12, a photoresist pattern 104 is formed by patterning the photoresist layer. The photoresist pattern 104 is formed so as to cover every alternate portions of the surface of the semiconductor substrate, which are between the stripe-like films laminations. Further, the exposed portion of the element separating oxide film 101 which is on the surface of the substrate 100 is removed by etching, using the photoresist pattern 104 as a mask, thereby exposing a portion of the semiconductor substrate 100 which is covered so far with the isolation oxide film 101. At this time, if the etching is carried out under the condition that a word line, which is a layer common to the control gate 34, is not etched, it is possible to perform self-aligned removal of the exposed portion of the isolation oxide film 101 with respect to the word line.

Then, the photoresist pattern 104 is removed. Thereafter, the exposed surface region of the semiconductor substrate 100 is subjected to an ion implantation to form an impurity diffused layer, so that, as shown in FIG. 13, source diffusion layers of memory cells for each row or column and a source wiring layer for connecting the source diffusion layers are formed in self-alignment with respect to a control gate, in other words, a word line, of the memory cells for each row or column. In this manner, a self-aligned common source is formed.

However, in the case where the SAS technique has been applied to such a flash memory as described above, it has found that there are several disadvantages. These disadvantages will be described below with reference to FIG. 14.

First, in an etching process of removing an element separating isolation oxide film portion, an exposed surface region of silicon substrate which is to be formed as a diffusion layer of a memory cell is subjected to the etching. This etching is carried out under the conditions such that the element separating isolation film portion, that is, the element separating oxide film portion, is etched; on the other hand, the silicon substrate itself is not etched as much as possible. However, in this etching process, the exposed surface portion of silicon substrate is actually etched to some extent; for this reason, a cave 202 is generated in the vicinity of the source diffusion layer of the semiconductor substrate. The cave 202 causes various problems in that surface impurity concentration becomes unstable in an NOR type flash memory in which electrons are drawn into the source diffusion layer, and in that a gate bird's beak 203 is generated in an oxidation process, at a later step to vary or lower the erase speed.

Moreover, since the element separating isolation film is subjected to the etching for a long time according to the aforesaid SAS technique, there occurs a phenomenon that by-product or impurity is implanted in the edge portion of the floating gate 32 or the silicon substrate 100. For this reason, in the case of forming an oxide film 205 surrounding the floating gate at a later step of the etching process step, defects are generated in the oxide film 205, causing deterioration in charge conservation characteristics. In an extreme case, there occurs a phenomenon such as a short-circuit between the floating gate and the silicon substrate. A typical impurity includes C (carbon), for example. Such an impurity causes an interface state by its entrance in-between the floating gate and the semiconductor substrate to deteriorate the transistor characteristics.

As described above, in the SAS technique used for miniaturizing the memory cells, since the oxide film is subjected to the etching for a long time, there has arisen various problems of deteriorating performance and reliability of the semiconductor device due to the cave of the silicon substrate in the vicinity of the gate film structure and the entrance of impurity in-between the floating gate and the semiconductor substrate.

SUMMARY OF THE INVENTION

The present invention has been made in view of the background of the prior art, and the object of the present invention is to solve these problems without increasing the number of processes.

In the present invention, before an exposed portion of the element separating isolation film, that is, an element separating oxide film, is subjected to etching according to the SAS technique, an isolation film is laminated on the entirety of laminated gate structure, and thereafter, the exposed portion of the element separating isolation film, that is, an oxide film is removed by etching while protecting the side face of the floating gate with the isolation film.

According to the present invention, there is provided a method of manufacturing a semiconductor memory device, in which in formation of a nonvolatile memory cell array having a source diffusion layer wiring interconnecting a plurality of source diffusion layers of memory cells, a floating gate electrode and a control gate electrode, a portion of an element separating isolation film is removed by self-aligned etching with respect to the control gate electrode, and the source diffusion layer wiring is formed in a portion of a semiconductor substrate corresponding to the portion of the element separating isolation film, the method comprising the following process steps of: forming an isolation film at a side face of the gate electrode before removing the element separating isolation film portion; and removing the portion of the element separating isolation film by etching after the isolation film forming step.

Further, according to the present invention, there is provided a method of manufacturing a semiconductor memory device, in which in formation of a nonvolatile memory cell array having a source diffusion layer wiring of interconnecting a plurality of source diffusion layers of memory cells, a floating gate electrode and a control gate electrode, a portion of an element separating isolation film is removed by self-aligned etching with respect to the control gate electrode, and the source diffusion layer wiring is formed in a portion of a semiconductor substrate corresponding to the portion of the element separating isolation film, the method comprising the following process steps: forming a protective isolation film on a conductive layer before subjecting the conductive layer for the control gate electrode to patterning to form a protective isolation film, which is used as a cap layer, on the control gate electrode in self-alignment therewith, in patterning of the conductive layer; forming an isolation film at a side face of the gate electrode before removing the portion of element separating isolation film; and removing the portion of the element separating isolation film by etching after the preceding step.

Also, the protective isolation film has a thickness which is set so as to be etched at a time equal substantially to the time spent in etching the element separating isolation film. Preferably, the protective isolation film and element separating isolation film have an etching rate substantially equal to each other. The element separating isolation film has a maximum thickness substantially equal to the thickness of the protective isolation film.

Furthermore, according to the present invention, there is provided a method of manufacturing a semiconductor memory device, comprising the following process steps of: forming a plurality of element separating isolation film in a stripe scheme on a surface of a semiconductor substrate; forming a laminated film comprising a first isolation film layer, a first conductive film layer having a slit formed on the element separating isolation film, a second isolation film layer and a second conductive film layer, which are successively formed in the order on the surface of the semiconductor substrate; patterning the laminated film in a stripe scheme in the direction orthogonal to the element separating isolation film, to form a plurality of strip-like gate laminations, which is constructed so that the first isolation film layer is used as a gate isolation film, the first conductive film layer is used as a floating gate, the second isolation film layer is used as an interlayered isolation film and the second conductive film layer is used as a control gate; forming a protective isolation film on a side wall of the gate laminations; forming a resist film covering every other portions of the surface of the semiconductor substrate, which are between the gate laminations; and removing the portion of exposed element separating isolation film by etching, using the resist as a mask.

Also, the laminated film may include further a gate protective isolation film formed on the second conductive film layer. In this case, the gate protective isolation film has a thickness which is set so as to be etched at a time equal substantially to the time spent in etching the element separating isolation film. Preferably, the gate protective isolation film and element separating isolation film have an etching rate substantially equal to each other, and the element separating isolation film has a maximum thickness substantially equal to the thickness of the gate protective isolation film.

As described above, according to the present invention, the SAS process is carried out after protecting the side face of memory cell with an isolation film, so that the floating gate of a memory cell transistor is not exposed by etching. As a result, the semiconductor substrate portion in the vicinity of the edge of the floating gate is not caved. Also, variation in erasable characteristics of memory cells can be prevented.

Moreover, according to the present invention, it is possible to considerably prevent a by-product from entering into the lamination gate structure during etching. In addition, even if the by-product enters into the lamination gate structure, it enters into a place separated from the floating gate, and the peripheral portions of the floating gate are already covered with an isolation film including thick sidewall isolation film layer. Therefore, this serves to prevent deterioration in pressure between the floating gate and the substrate, deterioration in charge conservation characteristics, and bad influence onto transistor characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross sectional view of a memory structure in one process of a manufacturing method of a semiconductor memory device according to a first embodiment of the present invention;

FIG. 2 is a cross sectional view of a memory structure in one process of the manufacturing method of the semiconductor memory device according to the first embodiment of the present invention;

FIG. 3 is a cross sectional view of a memory structure in one process of the manufacturing method of the semiconductor memory device according to the first embodiment of the present invention;

FIG. 4 is a cross sectional view of a memory structure in one process of the manufacturing method of the semiconductor memory device according to the first embodiment of the present invention;

FIG. 5 is a cross sectional view of a memory structure in one process of the manufacturing method of the semiconductor memory device according to the first embodiment of the present invention;

FIG. 6 is a cross sectional view of a memory structure in one process of the manufacturing method of the semiconductor memory device according to the first embodiment of the present invention;

FIG. 7 is a cross sectional view of a memory structure in one process of a manufacturing method of a semiconductor memory device according to a second embodiment of the present invention;

FIG. 8 is a cross sectional view of a memory structure in one process of the manufacturing method of the semiconductor memory device according to the second embodiment of the present invention;

FIG. 12 is a perspective view of a memory structure in one process of the conventional manufacturing method of the semiconductor memory device;

FIG. 13 is a perspective view of a memory structure in one process of the manufacturing method of the semiconductor memory device;

FIG. 14 is a cross sectional view of a memory structure in one process of the conventional manufacturing method of a semiconductor memory device, used to explain the disadvantages of the conventional manufacturing method;

DETAILED DESCRIPTION OF THE PREFERRED EMBODIMENT

Embodiments of the present invention will be described below with reference to the accompanying drawings.

Figure 10:
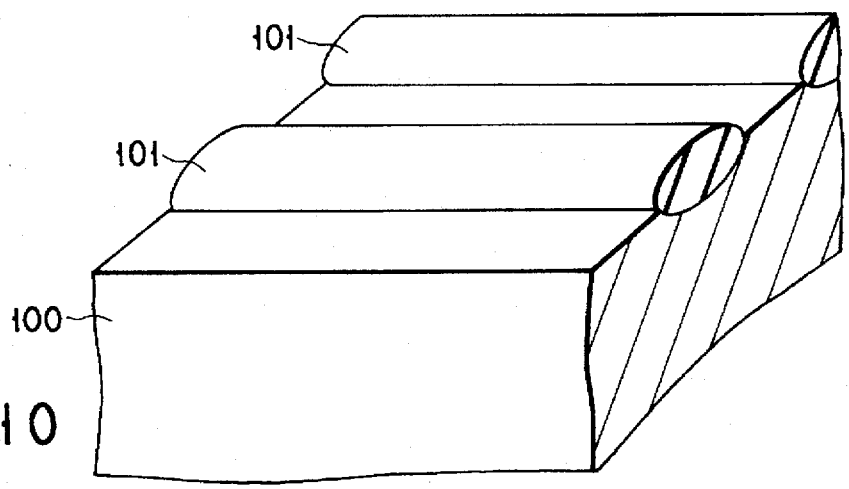
FIG. 10 is a perspective view of a memory structure in one process of a manufacturing method of the semiconductor memory device according to the present invention and a conventional manufacturing method of the same.
Figure 11:
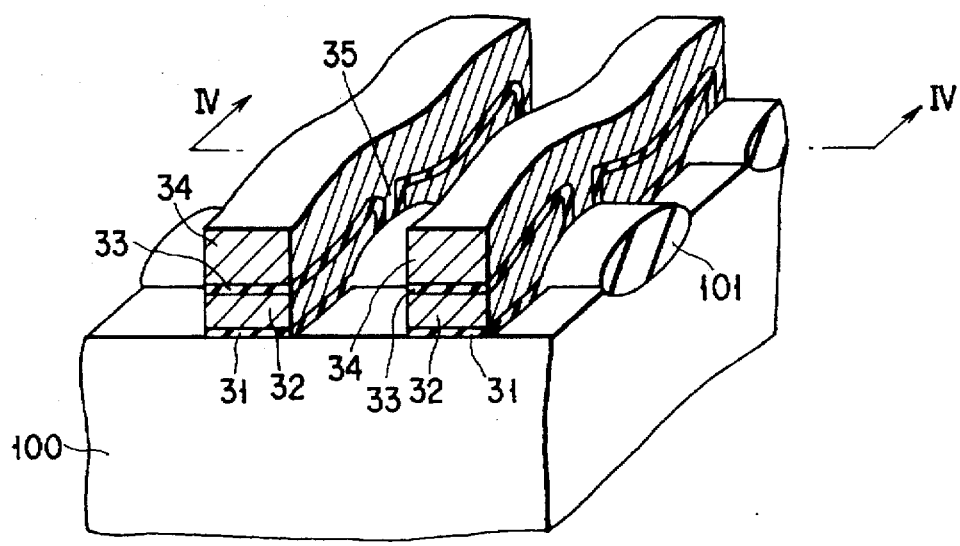
FIG. 11 is a perspective view of a memory structure in one process of the manufacturing method of the semiconductor memory device according to the present invention and the conventional manufacturing method of the same.

As shown in FIG. 10, the surface of a silicon semiconductor substrate 100 are formed in a stripe scheme with a plurality of element separating oxide films ($SiO_2$ films) 101 (for simplification of illustration, there are shown only two) by means of a LOCOS method (selective oxidation method), etc. Subsequently, a laminated gate structure comprising a floating gate, a control gate, etc., is further formed on the formed isolation oxide films as shown in FIG. 11. The formation of the device structure will be described in detail below. As described above, the element separating oxide film layer 101 are formed in a stripe scheme on the surface of a semiconductor substrate 100 by means of the LOCOS method, for example. Next, a lamination film is formed on the substrate 100 in which the element separating oxide films 101 are already formed. The lamination film comprises an oxide film layer 31, a polysilicon layer 32 having a slit formed on the element separating oxide films 101, an oxide film layer 33 and a polysilicon layer 34, which are formed in the order on the semiconductor substrate 100. Subsequently, the lamination film is patterned in a stripe scheme in the direction orthogonal to the element separating oxide film layers 101. As a result, the oxide film layer 31 is formed as a gate isolation film, the polysilicon layer 32 is formed as a floating gate, the oxide film layer 33 is formed as an interlayer isolation film and the polysilicon layer 34 functions as not only a control gate but also a word line. This forming process described above is the same as the foregoing conventional one. A WSi (tungsten silicide) layer may be used as the control gate 34.

Subsequently, as shown in FIG. 1, an ion implantation is carried out by means of a known method in order to form a source diffusion layer and a drain diffusion layer of a memory cell transistor. For instance, an ionized arsenic of $5 \times 10^{15}$ $cm^{-2}$ and an ionized arsenic of $2 \times 10^{15}$ $cm^{-2}$ are implanted at the respective steps at an acceleration voltage of 40 KeV in order to form a source diffusion layer 301 and a drain diffusion layer 302, respectively. FIG. 1 is a cross sectional view corresponding to a cross section viewed from the front of FIG. 11, showing a cross section of a region where no isolation oxide film 101 exists on the substrate.

As shown in FIG. 2, a thermal oxidation film 401 with a thickness of about 20 nm is formed on the entire surface of the substrate including the gate structure, and thereafter, an oxidation film 402 with a thickness of about 100 nm is further deposited on the entire surface of the substrate including the gate structure by means of a well-known method such as a CVD method. Subsequently, these oxidation films 401 and 402 are subjected to anisotropic RIE etching. As a consequence, the oxide film 402 remains only on a side wall of the gate structure, as shown in FIG. 3.

A photoresist is applied onto the entire surface of the substrate including the gate structure to form a photoresist layer. Subsequently, the formed photoresist layer is subjected to a photolithographic process, and a photoresist pattern 601 is formed. The photoresist pattern 601 has an opening in a region for a source diffusion wiring formation of the semiconductor substrate, as shown in FIG. 4. FIG. 4 is a cross sectional view corresponding to a cross sectional view taken along the line IV—IV of FIG. 11, showing a cross section of a region where an isolation oxide film exists. Next, a portion of the isolation oxide film 101 on the region for a source diffusion wiring formation is removed by means of the anisotropic etching, using the photoresist pattern 601 as a mask. The isolation oxide film formed in a stripe scheme has a thickness of about 20 nm, for example. FIG. 5 is a cross sectional view at this state, corresponding to the front cross sectional view of FIG. 11. As seen from FIG. 4 and FIG. 5, an edge portion of the floating gate is covered with the oxide film formed on the side of the gate structure, in order to protect the edge portion thereof. Thus, the edge portion of the floating gate is prevented from being exposed by etching of the oxide film.

Thereafter, in order to form a source wiring layer 801 for connecting source diffusion layers 301 of memory cells, an N type impurity is introduced into a substrate surface region where the foregoing isolation oxide film portion is removed, as shown in FIG. 6. In this case, an ionized arsenic of $2 \times 10^{15}$ cm$^{-2}$ is implanted in the substrate region as an N type impurity at an acceleration voltage of 40 KeV. FIG. 6 is a cross sectional view corresponding to a cross sectional view taken along the line IV—IV of FIG. 11.

An ion implantation is subjected to a peripheral region of memory cell array to form a peripheral circuit, and thereafter, an interlayer insulating film, a contact hole and a wiring layer are formed, thus a semiconductor memory device is provided.

However, in the case where the thickness of the element separating oxide film to be removed is thick, this makes long etching time to remove the isolation oxide film; for this reason, there may not provide the side-wall oxide film having such a shape as shown in FIGS. 4 and 5. Specifically, during the etching of the isolation oxide film portion situated on the source wiring layer region, the side-wall oxide film 402 is gradually removed, and at least, the edge portion of the interlayer isolation oxide film 33 between the floating gate and the control gate is exposed to the etching. In an extreme case, the side-wall oxide film wholly disappears due to excessive etching. Further, there may occur a case where the edge portion of the gate oxide film 31 between the floating gate and the substrate is exposed to the etching. If such a case occurs, there will be arisen a problem in that reliability of the isolation oxide film lowers. In particular, if the isolation oxide film is etched in the vicinity of the floating gate, the present invention will not obtain expected effects.

Figure 9:
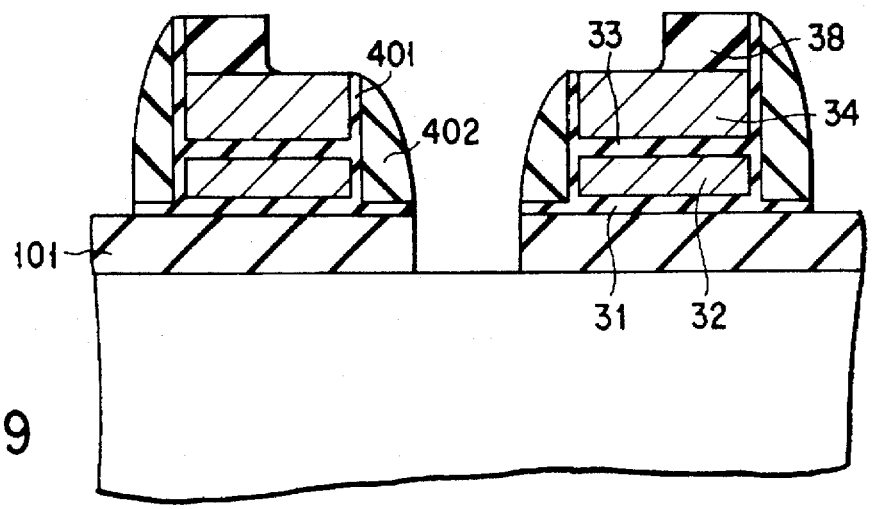
FIG. 9 is a cross sectional view of a memory structure in one process of the manufacturing method of the semiconductor memory device according to the second embodiment of the present invention.

To avoid the disadvantage described above, a second embodiment is shown in FIG. 7 to FIG. 9. According to this second embodiment, an oxide film 38 is previously formed as a cap film on the polysilicon layer 34 before a word line 34 is patterned on the polysilicon layer. The oxide film 38 is formed so as to have a thickness equal substantially to that of the isolation oxide film 101 to be etched. Subsequently, the cap film is patterned so as to be self-aligned with respect to the word line, as shown in FIG. 7. The forming method comprises a process of forming an isolation film constituting a cap layer on the polysilicon layer forming the word line 34 before the polysilicon layer is patterned, a lithography process, a cap film etching process and a gate etching process. Thereafter, the process shown in FIG. 2 of the aforesaid embodiment and the subsequent process may be carried out. FIG. 7 to FIG. 9 are views schematically corresponding to FIG. 4 of the first embodiment. FIG. 7 shows a cross section of a gate structure of the exposed portion of the element separating oxide film 101 before etching, FIG. 8 showing a cross section of the gate structure after etching, and FIG. 9 showing a cross section of the gate structure after the resist pattern 80 is removed by ashing. As seen from FIGS. 8 and 9, when etching the exposed portion of the element separating oxide film 101, the cap layer 38 and the oxide films 401 and 402 are simultaneously etched. However, a gradient of the shoulder of the side-wall oxide film can be set to a predetermined height by adjusting the film thickness of the cap layer 38. This serves to prevent the isolation film between the floating gate and the control gate from being exposed. Preferably, the cap layer has a film thickness equal substantially to the thickness of element separating isolation film when the cap layer 38 is made of the same material as the element separating isolation film. For example, in the case where the element separating oxide film is made of SiO$_2$ and has a thickness of 250 nm, the cap layer 38 is preferably made of SiO$_2$ and has a thickness of about 250 nm. However, if the cap layer is formed extremely thick, when the gate oxide film is etched, there occurs microloading effect that lowers the etching speed when a distance between control gates is narrow, causing a problem in controllability. Moreover, there has arisen a problem in that a size conversion difference is generated during the cap layer forming process. In consideration of the above problems, the cap layer should have a minimum required thickness. In the description, the microloading effect is a phenomenon that etching rate of portion to be etched differs from dense and sparse portions in pattern density. On the other hand, the conversion difference means the difference in dimension caused between the top and bottom of the cap layer in the case where the cap layer is not wholly vertically etched.

With the manufacturing methods in the above described embodiments, the following problem may arise. Specifically, the gate layer 34 is often made of WSi (tungsten silicide) or the like. When such a gate layer 34 made of WSi or the like is exposed after it has been once subjected to a thermal heating oxidation process, the WSi layer 34 is greatly oxidized and the oxidized surface portion is expanded and exfoliated in the following process. This is not a significant problem in the conventional manufacturing method, since in the conventional manufacturing method a thermal oxidation process for forming an oxide film on the layer 34 is not performed before the SAS etching is performed. On the other hand, in the manufacturing methods according to the present invention, the oxide film 401 is first formed, the side-wall oxide film 402 is formed, and then the SAS etching is performed. That is, the WSi layer 34 has been subjected to a thermal oxidation process already when the SAS etching is performed. If, in this state, the WSi layer 34 is exposed as in the above described embodiments, the above mentioned problem will occur at a later performed process step. To avoid this problem, SiN or the like can be used as a cap film material, which is not etched in etching the element separating oxide film and the side-wall oxide film. With this approach, it is possible at least to prevent exposure of the upper surface of the WSi layer 34. On the other hand, even with this approach, the side surface of the WSi layer 34 may be exposed. However, if the exposed side surface is small, the above mentioned problem does not easily occur. The SiN film can be formed by a CVD method, for example.

Figure 15:
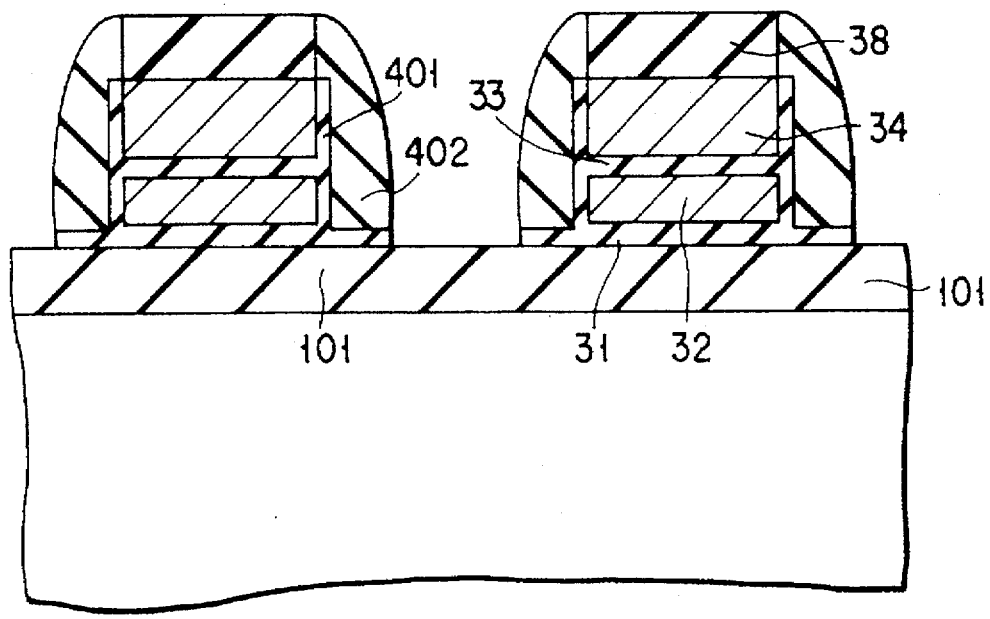
FIG. 15 is a cross sectional view of a memory structure in one process of a manufacturing method of a semiconductor memory device according to a third embodiment of the present invention.
Figure 16:
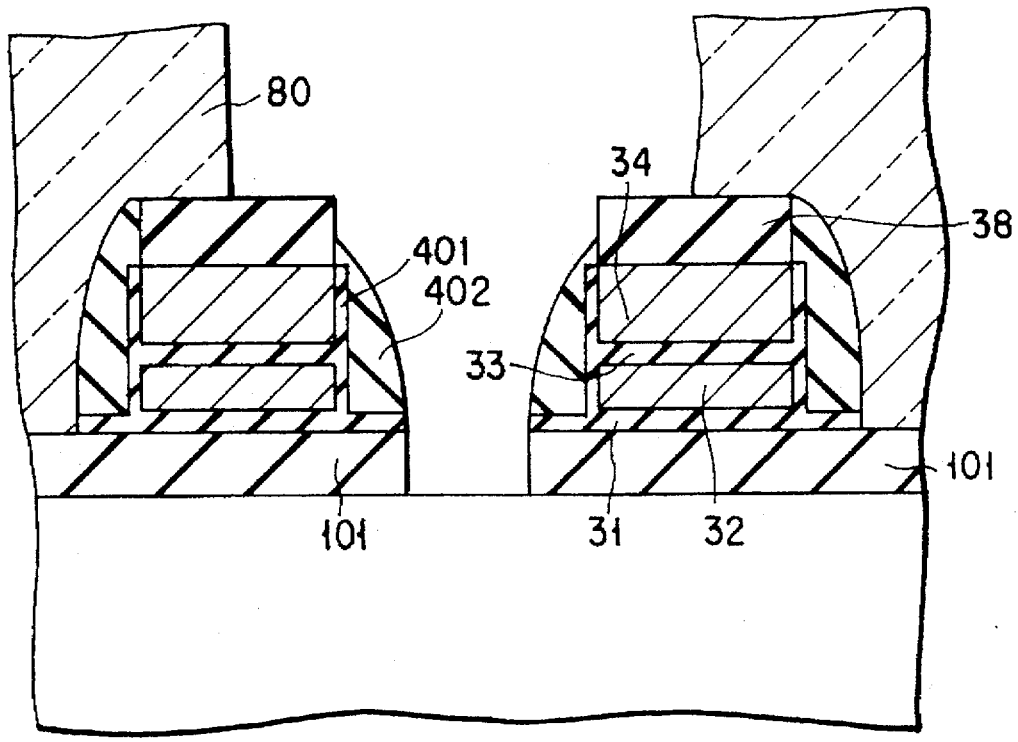
FIG. 16 is a cross sectional view of a memory structure in one process of the manufacturing method of the semiconductor memory device according to the third embodiment of the present invention.
Figure 17:
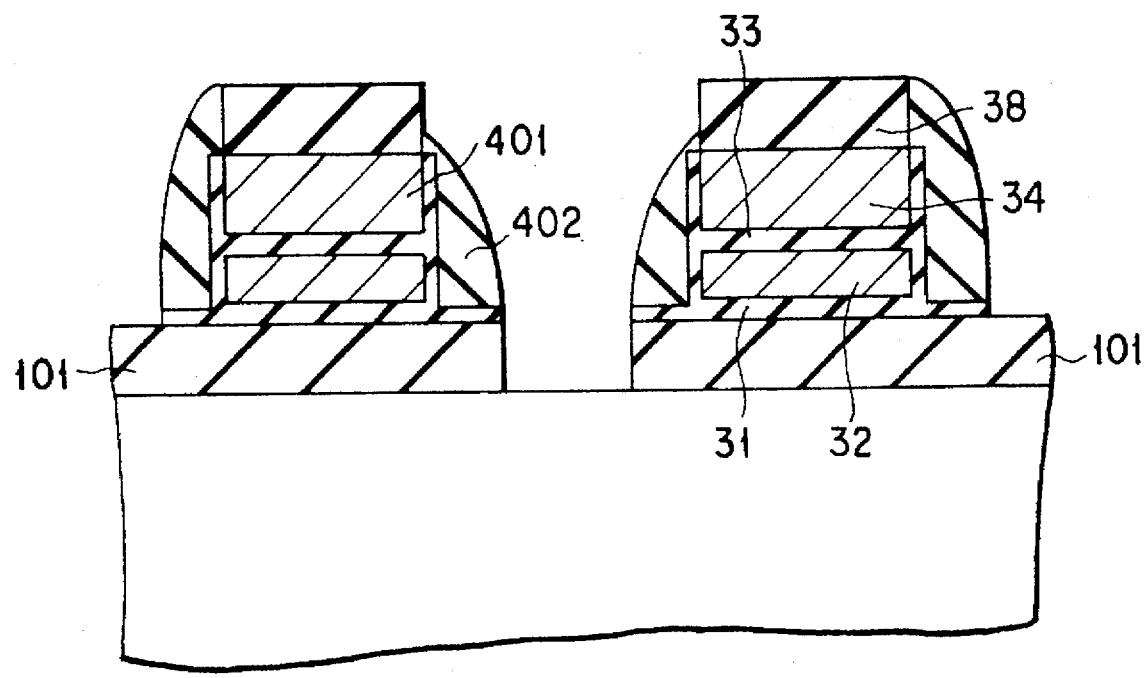
FIG. 17 is a cross sectional view of a memory structure in one process of the manufacturing method of the semiconductor memory device according to the third embodiment of the present invention.

If the cap film is made thick as shown in FIGS. 15 to 17, it is possible to prevent any portion of the layer 34 being exposed, even if the cap layer 34 is not formed of WSi. FIGS. 15 to 17 correspond to FIGS. 7 to 9.

In the present invention, the side-wall film on the side of cells should be formed of an electrically isolation material. If polycrystal silicon is used as a material of the side-wall film, there is a risk that a short-circuit is generated between the silicon substrate and the polycrystal silicon side-wall film. Since only a thin oxide film is formed between the side-wall film and the floating gate or the control gate, if the short-circuit is generated, charge conservation characteristics deteriorate or short-circuit is generated between the floating gate and the silicon substrate. For this reason, the effect of the present invention can not be achieved.

As described above, according to the present invention, the SAS process is carried out after protecting the side surface of memory cell with an isolation film, so that a silicon substrate portion of the vicinity of the floating gate of a memory cell transistor is not exposed by etching. As a result, also, no variation in erasable characteristics occurs, and there can be developed stable characteristics of memory cells. Moreover, according to the present invention, there is no entrance of a by-product into the floating gate region during etching. In addition, the floating gate is covered with an isolation film including thick side-wall isolation film layer. Therefore, this serves to prevent deterioration in withstand pressure between the floating gate and the substrate, deterioration in charge conservation characteristics, and bad influence onto transistor characteristics. Thus, reliability of products can be greatly improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A method of manufacturing a semiconductor memory device in which, during formation of a nonvolatile memory cell array having memory cells each including a source rework a drain region, a floating gate electrode, and a control gate electrode, and a source diffusion layer wiring interconnecting a plurality of sources of said memory cells, portions of an element isolating film are removed by self-aligned etching with respect to said control gate electrodes, and said source diffusion layer wiring is formed in portions of a semiconductor substrate corresponding to said removed portions of said element isolating film, the method comprising:
forming a protective insulating film made of the same material as said element isolating film on a conductive layer and patterning said protective insulating film and said conductive layer to form said control gate electrodes having insulating cap layers thereon;
forming an oxide film at side faces of said control gate electrodes and said cap layers before removing said portions of said element isolating film; and
removing said portions of said element isolating film by etching,
wherein said protective insulating film and element isolating film have etching rates substantially equal to each other, and said protective insulating film is formed to a thickness substantially equal to a maximum thickness of said element isolating film.

2. The method of manufacturing a semiconductor memory device according to claim 1, wherein said material is $SiO_2$.

3. A method of manufacturing a semiconductor memory device, comprising the steps of:
forming spaced apart element isolating film strips on a surface of a semiconductor substrate;
forming a laminated film on the surface of said semiconductor substrate and said element isolating film strip, said laminated film comprising a first insulating film layer, a first conductive film layer having slits formed wherein above said element isolating film strips, a second insulating film layer, a second conductive film layer, and a third insulating film layer, said third insulating film layer formed of the same material as said element isolating strips;
patterning said laminated film to form a plurality of spaced apart laminated gate film strips which extend in a direction orthogonal to said element isolating film strips, wherein remaining portions of said first insulating film layer constitute gate insulating films, remaining portions of said first conductive film layer constitute floating gates, remaining portions of said second insulating film layer constitute interlayer insulation films, remaining portions of said second conductive film layer constitute control gates, and remaining portions of said third insulating film layer constitute gate protective insulating films;
forming a protective oxide film on side walls of said laminated gate film strips;
forming a patterned resist film in the spaces between alternate pairs of said laminated gate film strips; and
removing exposed portions of said element isolating film strips by etching, using said patterned resist as a mask,
wherein said third insulating film layer and said element isolating film strips have etching rates substantially equal to each other, and said third insulating film layer is formed to have a thickness substantially equal to a maximum thickness of said element isolating film strips.

4. The method of manufacturing a semiconductor memory device according to claim 3, wherein said gate protective insulating films have a thickness which is set so as to be etched in a time substantially equal to the time spent in etching said element isolating film.

5. The method of manufacturing a semiconductor memory device according to claim 4, wherein said material is $SiO_2$.

6. A method of forming a semiconductor memory device, the method comprising the steps of:
forming spaced apart insulative strips extending in a first direction on a surface of a semiconductor substrate;
forming spaced apart stacked-gate structures extending in a second direction perpendicular to the first direction on the surface of said semiconductor substrate, said stacked-gate structures each including stacked gates and an insulative cap layer;
forming source and drain regions by implanting impurities into the surface of said semiconductor substrate using said insulative strips and said stacked-gate structures as a mask;
forming an insulating film on the side walls of the stacked gates and the insulative cap layers of said stacked-gate structures;
forming a mask layer and patterning said mask layer so as to remain in the spaces between alternate pairs of said stacked-gate structures;
etching the exposed portions of said insulative strips using said patterned mask layer as a mask, wherein said insulating film protects the stacked gates of said stacked-gate structures during the etching; and
forming source interconnection regions by implanting impurities into portions of the surface of said semiconductor substrate from which the exposed portions of said insulative strips have been etched.

7. The method according to claim 6, wherein said insulative strips are formed by local oxidation of silicon (LOCOS).

8. The method according to claim 6, wherein the thickness of said insulative cap layers and the maximum thickness of said insulative strips is about 250 nanometers.

9. The method according to claim 6, wherein said insulative cap layers and said insulative strips comprise silicon dioxide ($SiO_2$).

10. The method according to claim 6, wherein the stacked gates of said stacked-gate structures include floating gates insulatively spaced from the surface of said semiconductor substrate and a control gate insulatively spaced from each of said floating gates.

11. The method according to claim 10, wherein said control gate comprises tungsten silicide (WSi).

12. The method according to claim 6, wherein the step of forming source and drain regions comprises implanting arsenic impurities.

13. The method according to claim 6, wherein the step of forming source interconnection regions comprises implanting arsenic impurities.

14. The method according to claim 6, wherein said insulating cap layers have an etching rate which is substantially the same as the etching rate of said insulative strips and the thickness of said insulative cap layers substantially equal to the maximum thickness of said insulative strips.

* * * * *

UNITED STATES PATENT AND TRADEMARK OFFICE
CERTIFICATE OF CORRECTION

PATENT NO. : 5,736,442
DATED : April 7, 1998
INVENTOR(S) : Seiichi MORI

It is certified that error appears in the above-indentified patent and that said Letters Patent is hereby corrected as shown below:

In Claim 1, line 4, change "rework" to --region,--.

Signed and Sealed this

Fourteenth Day of July, 1998

Attest:

BRUCE LEHMAN

*Attesting Officer*   *Commissioner of Patents and Trademarks*